(12) United States Patent
Ho et al.

(10) Patent No.: US 6,369,455 B1
(45) Date of Patent: Apr. 9, 2002

(54) EXTERNALLY-EMBEDDED HEAT-DISSIPATING DEVICE FOR BALL GRID ARRAY INTEGRATED CIRCUIT PACKAGE

(75) Inventors: Tzong-Da Ho, Taichung; Chien-Ping Huang, Hsinchu Hsien; Jeng-Yuan Lai, Taichung, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/545,357

(22) Filed: Apr. 7, 2000

(30) Foreign Application Priority Data

Jan. 4, 2000 (TW) .......................................... 89100073

(51) Int. Cl.[7] .............................................. H01L 23/28
(52) U.S. Cl. ....................................... 257/796; 257/730
(58) Field of Search ................................. 257/720, 730, 257/787, 796

(56) References Cited

U.S. PATENT DOCUMENTS

| | | | |
|---|---|---|---|
| 5,208,831 A | 5/1993 | Ueno et al. ..................... 375/7 |
| 5,278,865 A | 1/1994 | Amrany et al. ................. 375/8 |
| 5,432,513 A | 7/1995 | Okamoto ..................... 341/108 |
| 5,457,717 A | 10/1995 | Bellamy ....................... 375/372 |
| 5,481,574 A | 1/1996 | Evert et al. .................. 375/356 |
| 5,705,851 A | * 1/1998 | Mostafazadeh et al. ....... 257/796 |
| 5,706,335 A | 1/1998 | Hinderks ....................... 379/93 |
| 5,790,891 A | 8/1998 | Solt et al. ..................... 395/854 |
| 5,828,696 A | 10/1998 | Gelblum et al. .............. 375/222 |
| 5,835,787 A | 11/1998 | Raffman et al. ............. 395/841 |
| 5,883,430 A | * 3/1999 | Johnson ....................... 257/796 |
| 5,903,775 A | 5/1999 | Murray ......................... 395/853 |
| 6,011,955 A | 1/2000 | Tsuchiyama ............... 455/38.4 |

* cited by examiner

Primary Examiner—Roy Potter
(74) Attorney, Agent, or Firm—Peter F. Corless; Steven M. Jensen; Edwards & Angell, LLP

(57) ABSTRACT

An externally-embedded heat-dissipating device is designed for use with a BGA (Ball Grid Array) IC package for dissipating the IC-produced heat during operation to the atmosphere. that can help further increase the efficiency of heat dissipation from the BGA IC package. The heat-dissipating device is characterized in that it can be externally embedded in the top surface of the encapsulant without having to be supported on the substrate, and also in that it can help reduce the heat path from the IC chip to the heat-dissipating device so that heat-dissipation efficiency can be further increased as compared to the prior art. Further, the heat-dissipating device can help reduce manufacture cycle time and cost and also help prevent delamination, flash, and popcorn effect that would otherwise occur in the case of the prior art. It also can help save layout space over the substrate for compact design of the package. Overall speaking, the proposed heat-dissipating device is more advantageous to use than the prior art.

14 Claims, 5 Drawing Sheets

EXTERNALLY-EMBEDDED HEAT-DISSIPATING DEVICE FOR BALL GRID ARRAY INTEGRATED CIRCUIT PACKAGE

BACKGROUND OF THE INVENTION

1. Field of the Invention

This invention relates to integrated circuit (IC) packaging technology, and more particularly, to an externally-embedded heat-dissipating device which is designed for use with a BGA (Ball Grid Array) IC package for dissipating the IC-produced heat during operation to the atmosphere.

2. Description of Related Art

The BGA IC packaging technology allows the IC package to be made very small in height while nevertheless incorporating a large packing density of transistor elements with a large number of I/O pins. During the operation of the internal circuitry of the IC package, a large amount of heat can be generated due to the flowing of electricity through the transistor elements on the IC chip. If this heat is not dissipated, it can cause damage to the internal circuitry of the IC chip. Therefore, it is required to provide heat-dissipating means on the IC package for heat dissipation during operation.

Types of BGA IC packages include PBGA (Plastic BGA), and TBGA (Tape BGA), which are so named in terms of the material being used to form the substrate. These BGA IC packages, however, are poor in heat-dissipating efficiency since plastics, and tape are poor in heat conductivity. To allow BGA IC packages to have a high heat-dissipating efficiency, a conventional solution is to provide a heat sink or a heat slug.

FIG. 13 is a schematic sectional diagram of a BGA IC package installed with a conventional heat-dissipating device. As shown, the BGA IC package includes an encapsulant 110, a substrate 120, and an IC chip 130 which is attached on the substrate 120 by means of silver paste 140 and is electrically connected to the substrate 120 via a plurality of gold wires 150. In addition, this BGA IC package is embedded with a thermally-conductive piece 100 in the encapsulant 110. The thermally-conductive piece 100 has a support portion 101 formed in such a manner that it can support the main body of the thermally-conductive piece 100 in an overhead manner above the IC chip 130. In the manufacture of this BGA IC package, the die-bonding process and the wire-bonding process are performed first; and after the gold wires 150 are readily bonded, the thermally-conductive piece 100 is attached onto the substrate 120 by means of an adhesive 160. After this, a molding process is performed to form the encapsulant 110 to encapsulate the IC chip 130, the gold wires 150, and the thermally-conductive piece 100, while exposing the top surface 102 of the thermally-conductive piece 100 to the outside of the encapsulant 110 so that the thermally-conductive piece 100 can come into touch with the atmosphere.

Typically, the IC chip 130 has a thickness of $a=0.33$ mm (millimeter); the thermally-conductive piece 100 has a thickness of $c=0.3$ mm; and the encapsulant 110 has a thickness of $D=1.17$ mm. Therefore, the bottom side of the thermally-conductive piece 100 is separated from the top side of the IC chip 130 by a distance of $b=D-a-c=1.17-0.3-0.33=0.54$ mm. This shows that the heat produced in the IC chip 130 during operation will be conducted through this 0.54 mm part of the encapsulant 110 to the thermally-conductive piece 100 where the heat can be more rapidly dissipated to the atmosphere since the thermally-conductive piece 100 has better thermal conductivity than the encapsulant 110. Compared to a BGA IC package without such a heat-dissipating device, the top side of the IC chip 130 is separated from the top side of the encapsulant 110 by a distance of $b+c=D-a=1.17-0.33=0.84$ mm; and therefore, the IC-produced heat will be conducted entirely through a 0.84 mm part of the encapsulant 110 to the atmosphere. From experimentation, it shows that the heat-dissipating device depicted in FIG. 13 can help increase the heat-dissipation efficiency by a factor of from 10% to 20% as compared to a BGA IC package without the heat-dissipating device.

FIG. 14 is a schematic sectional diagram of a BGA IC package installed with a modified heat-dissipating device that can help further increase heat-dissipation efficiency. As shown, the thermally-conductive piece shown in FIG. 13 is here modified in such a manner that it is formed with a downward-protruded portion 103' so as to further reduce the heat path between the IC chip 130' and the thermally-conductive piece 100'.

The foregoing two kinds of heat-dissipating devices shown in FIGS. 13 and 14, however, would cause the following drawbacks.

First, the mounting of these two conventional heat-dissipating devices on the substrate would require precise positioning so as to prevent the IC chip and gold wires from being damaged thereby. Moreover, an additional baking process is required to allow these two kinds thermally-conductive pieces to be securely fixed in position in the encapsulant, thus undesirably increasing the cycle time and complexity of the manufacture process, making the manufacture not very cost-effective.

Second, these two conventional heat-dissipating devices would be easily subjected to delamination off the encapsulant due to the fact that they are made from a thermally-conductive material with a high coefficient of thermal expansion (CTE), typically from 16 ppm/° C. to 17 ppm/° C., while the encapsulant has a CTE of only about 13 ppm/° C. This CTE difference would cause the delamination whenever the package structure undergoes a cooling process subsequent to a high-temperature treatment as solder reflow or reliability test during temperature cycle. When delamination occurs, it would make the finished package poor in quality.

Third, these two conventional heat-dissipating devices would cause undesired popcorn effect during the molding process due to the reason that the support portions thereof would cause disturbance to the flowing resin used in the molding process and thus cause the undesired forming of voids in the resultant encapsulant. During the molding process, the solder reflow would easily cause the air within these voids to explode.

Fourth, these two conventional heat-dissipating devices would take up much layout space over the substrate, making the overall package configuration less compact in size and therefore unsuitable for use with the MCM (Multi-Chip Module) type of BGA IC packages.

Fifth, these two conventional heat-dissipating devices would easily cause the flowing resin used in the molding process to flash. This is because that these two conventional heat-dissipating devices are typically formed through a stamping process, which would easily cause the corners thereof to be rounded, thus allowing the flowing resin to easily pass through the rounded corners to the exposed surface. In addition, the flashed resin would make the exposed surface of the heat-dissipating device to be unplanarized, resulting in a less effective coupling of the heat-dissipating device to external heat-dissipation means.

The flashed resin can be removed through sanding or laser, but such post-treatment would degrade the outer appearance of the package configuration and make the overall manufacture process more complex, and is therefore undesired.

SUMMARY OF THE INVENTION

It is therefore an objective of this invention to provide an externally-embedded heat-dissipating device for BGA IC package, which can help reduce manufacture cycle time and cost while nevertheless providing a heat-dissipation efficiency.

It is another objective of this invention to provide an externally-embedded heat-dissipating device for BGA IC package, which can help prevent delamiantion so that the manufactured BOA IC package can be assured in quality.

It is still another objective of this invention to provide an externally-embedded heat-dissipating device for BGA IC package, which can help prevent the forming of voids in the encapsulant and thus prevent the undesired popcorn effect during the molding process.

It is yet another objective of this invention to provide an externally-embedded heat-dissipating device for BGA IC package, which takes up only a small area of the layout space on the substrate so that the overall package configuration can be made more compact.

It is still yet another objective of this invention to provide an externally-embedded heat-dissipating device for BGA IC package, which can help prevent the flash of flowing resin used in the molding process, so that it would be unnecessary to use sanding or laser means to remove flashed resin and thus allow the manufactured BGA IC package to be more assured in quality.

In accordance with the foregoing and other objectives, the invention proposes an improved heat-dissipating device for BGA IC package. The heat-dissipating device of the invention comprises embedding means formed in a surface of the encapsulant and at a proximate position to the IC chip; and a thermally-conductive piece accommodated in the embedding means, which has a first surface facing against the IC chip and a second surface exposed to the outside of the encapsulant. The embedding means is a recess predefined to be formed in the encapsulant during the molding process, and which can be formed by predefining a protruded portion on a mold used to form the encapsulant so that the recess can be readily formed during the molding process.

By the invention, the overall process for manufacturing the BGA IC package can be significantly reduced in complexity since it requires no premounting and baking of the heat-dissipating device as in the case of the prior art.

Moreover, since a thermally-conductive paste is used to adhere the heat-dissipating device of the invention to the encapsulant, it can act as a cushion to help prevent delamination of the heat-dissipating device from the encapsulant.

Furthermore, since the heat-dissipating device of the invention is externally embedded, without having to use support portions to be supported on the substrate, it would not cause disturbance to the flowing resin used in the molding process, making the resulted BGA IC package more assured in quality. In addition, since the heat-dissipating device of the invention would not occupy any layout space over the substrate, the BGA IC package can be made more compact.

Still moreover, since the mounting of the heat-dissipating device of the invention is carried out after the BGA IC package is completed, it can help prevent the occurrence of flash of the flowing resin used in the molding process.

Finally, the heat-dissipating device of the invention can provide the foregoing benefits but nevertheless allowing the heat-dissipation efficiency to be better than the prior art. The invention is also more advantageous to use when mounted on an MCM type of BGA IC package than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, a total of eleven preferred embodiments are disclosed in full details in the following with reference to FIG. 1 through FIG. 12.

Figure 1:
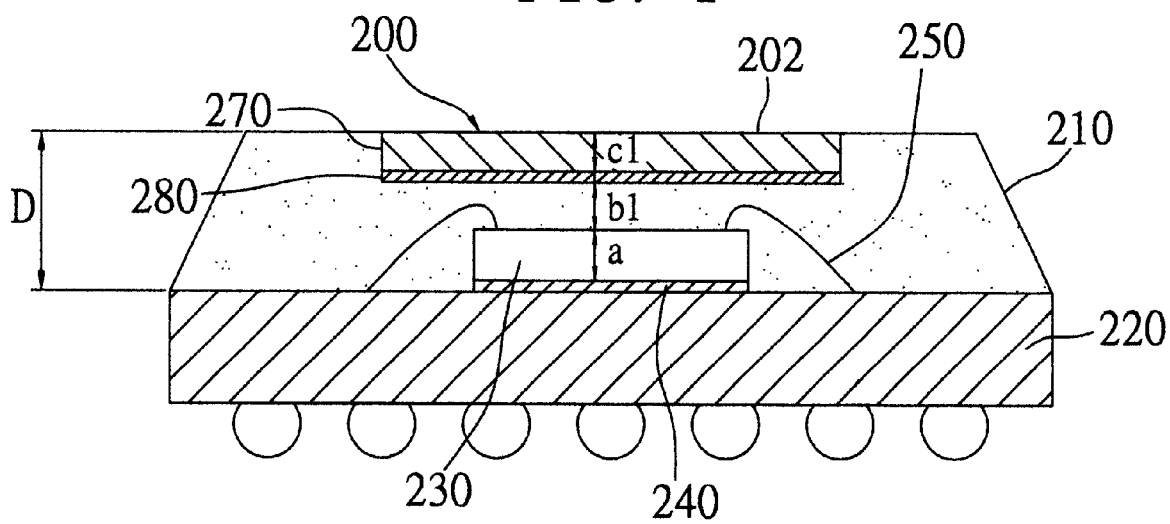
FIG. 1 is a schematic sectional diagram of a BGA IC package installed with a first preferred embodiment of the externally-embedded heat-dissipating device of the invention.
Figure 2:
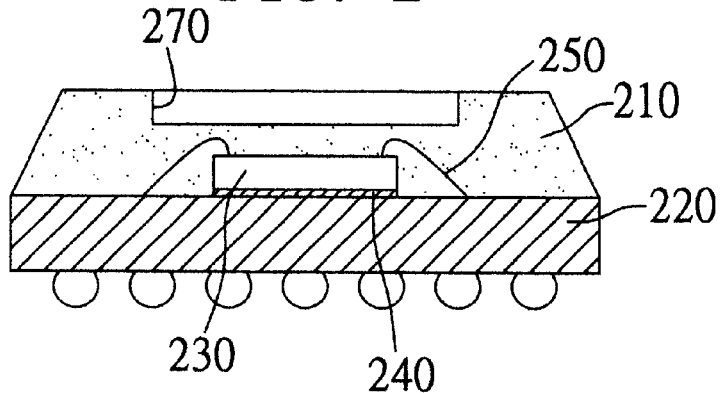
FIG. 2 is a schematic sectional diagram of the BGA IC package of FIG. 1 when dismounted with the heat-dissipating device of the invention.

First Preferred Embodiment (FIGS. 1 and 2)

FIG. 1 is a schematic sectional diagram of a BGA IC package mounted with a first preferred embodiment of the heat-dissipating device of the invention. As shown, this BGA IC package includes an encapsulant 210, a substrate 220, and an IC chip 230 which is attached on the substrate 220 by means of silver paste 240 and is electrically connected to the substrate 220 via a plurality of gold wires 250. As shown in FIG. 2, in accordance with the invention, embedding means, such as a recess 270, is formed on the top side of the encapsulant 210; and further, as shown in FIG. 1, a thermally-conductive piece 200 is embedded in the recess 270 in such a manner that its bottom side is attached by means of a thermally-conductive paste 280 to the bottom of the recess 270 while its top side 202 is exposed to the outside of the encapsulant 210.

Figure 13:
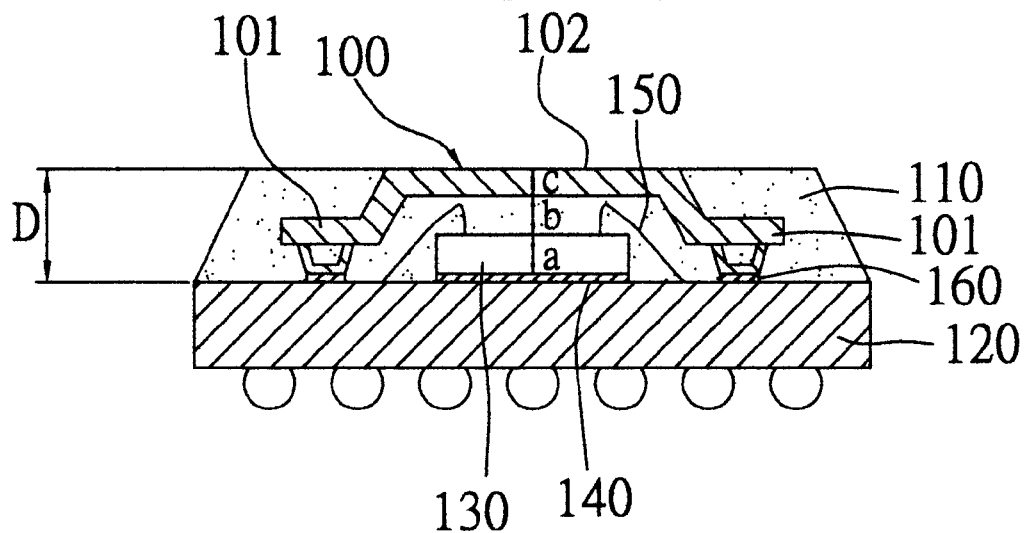
FIG. 13 (PRIOR ART) is a schematic sectional diagram of a BGA IC package installed with a first conventional heat-dissipating device.
Figure 14:
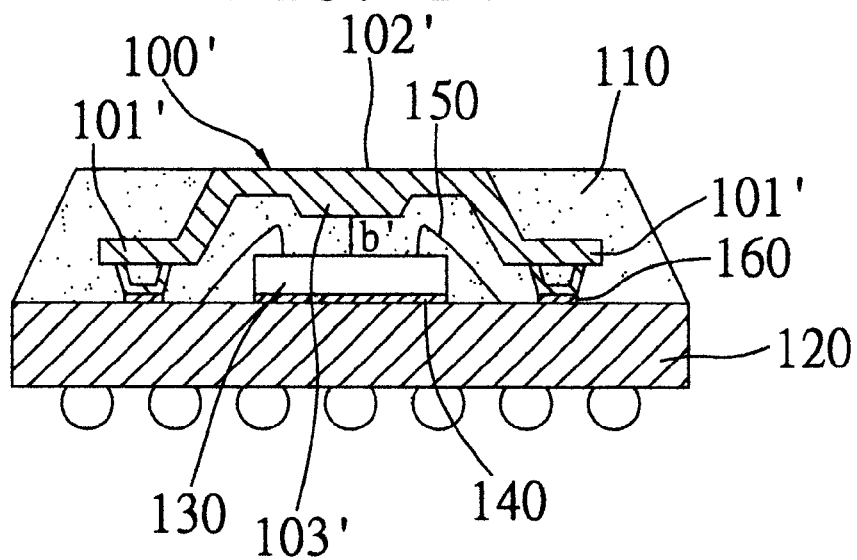
FIG. 14 (PRIOR ART) is a schematic sectional diagram of a BGA IC package installed with a first conventional heat-dissipating device.

By the invention, the thickness D of the encapsulant 210 and the thickness C1 of the thermally-conductive piece 200 can be the same as the prior art of FIG. 13, so that the heat path b1 from the IC chip 230 to the thermally-conductive piece 200 can also be the same as the prior art of FIG. 13. This allows the heat-dissipating device of the invention to provide at least the same heat-dissipation efficiency as the prior art of FIG. 13 but is much easier to manufacture than the prior art.

If a higher heat-dissipation efficiency is desired, the thickness C1 of the thermally-conductive piece 200 can be increased as large as it would not make the thermally-conductive piece 200 to come in contact with the gold wires 250 or the top surface of the IC chip 230. This can effectively reduce the heat path b1 from the IC chip 230 to the thermally-conductive piece 200, so that the heat produced by the IC chip 230 during operation can be conducted to the thermally-conductive piece 200 more quickly.

Figure 3:
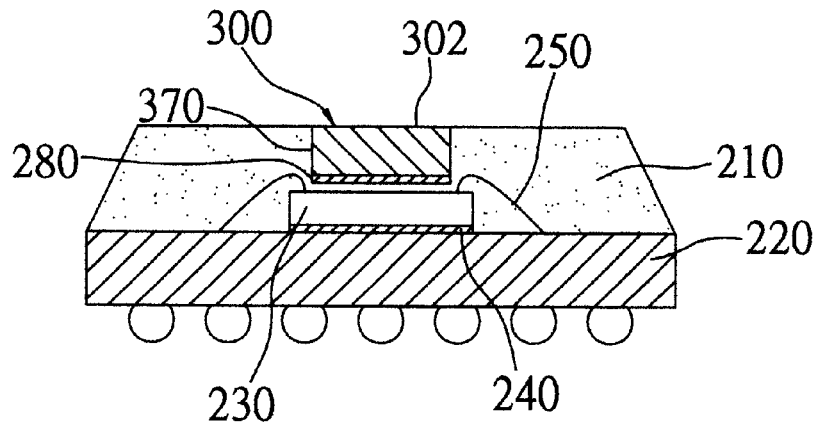
FIG. 3 is a schematic sectional diagram used to depict a second preferred embodiment of the invention.

Second Preferred Embodiment (FIG. 3)

FIG. 3 is a schematic sectional diagram used to depict the second preferred embodiment of the invention. In FIG. 3, the constituent parts that are identical in structure and purpose as those used in the previous embodiment shown in FIG. 1 are labeled with the same reference numerals.

This embodiment differs from the previous one only in that the thermally-conductive piece, here designated by the reference numeral 300, is downsized in width to an extent slightly smaller than the width of the IC chip 230 so that it can be further made deepened toward the IC chip 230 without touching the gold wires 250. Although in this embodiment the exposed surface 302 of the thermally-conductive piece 300 is correspondingly reduced, the resulted shortened heat path from the IC chip 230 to the thermally-conductive piece 300 can nevertheless help increase the overall heat-dissipation efficiency.

Figure 4:
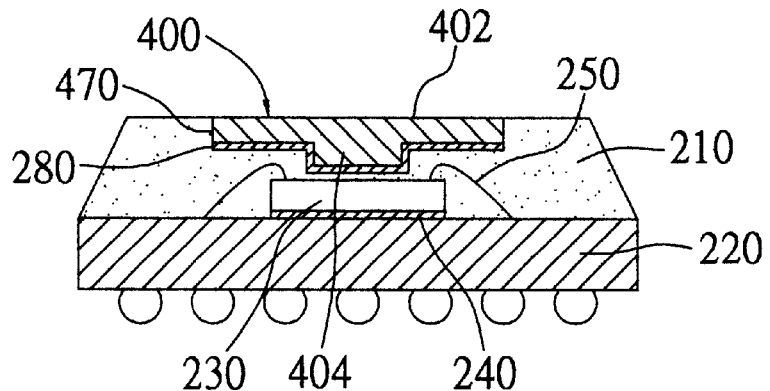
FIG. 4 is a schematic sectional diagram used to depict a third preferred embodiment of the invention.

Third Preferred Embodiment (FIG. 4)

FIG. 4 is a schematic sectional diagram used to depict the third preferred embodiment of the invention. In FIG. 4, the constituent parts that are identical in structure and purpose as those used in the previous embodiments are labeled with the same reference numerals.

This embodiment differs from the previous one only in that the thermally-conductive piece, here designated by the reference numeral 400, is formed with a substantially T-shaped cross section, with the top surface 402 being dimensioned in the same size as the first embodiment and the bottom part 404 being dimensioned to an extent slightly smaller than the width of the IC chip 230 so that the bottom part 404 can be made deepened toward the IC chip 230 without touching the gold wires 250. Since the thermally-conductive piece 400 of this embodiment is greater in volume than the previous two embodiments and allows a shortened heat path from the IC chip 230 to the thermally-conductive piece 300, its heat-dissipation efficiency is better than the previous two embodiments.

Figure 5:
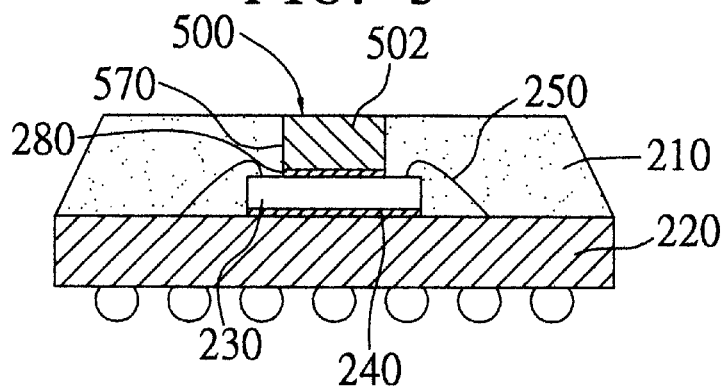
FIG. 5 is a schematic sectional diagram used to depict a fourth preferred embodiment of the invention.

Fourth Preferred Embodiment (FIG. 5)

FIG. 5 is a schematic sectional diagram used to depict the fourth preferred embodiment of the invention. In FIG. 5, the constituent parts that are identical in structure and purpose as those used in the previous embodiments are labeled with the same reference numerals.

This embodiment is similar to the one shown in FIG. 3 except that the thermally-conductive piece, here designated by the reference numeral 500, is deepened to such an extent as to come into direct contact with the IC chip 230 through the thermally-conductive paste 280, allowing the IC-produced heat during operation to be conducted directly through the exposed surface 502 of the thermally-conductive piece 500 to the atmosphere. To do this, however, the IC chip 230 should have a top surface that can come into direct contact with the thermally-conductive piece 500.

Figure 6:
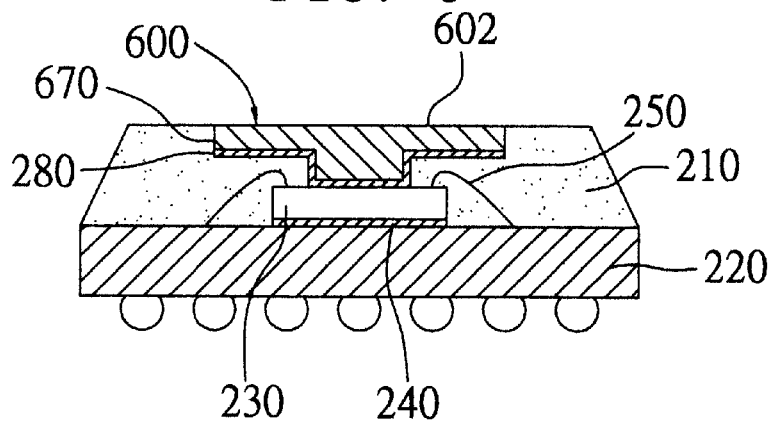
FIG. 6 is a schematic sectional diagram used to depict a fifth preferred embodiment of the invention.

Fifth Preferred Embodiment (FIG. 6)

FIG. 6 is a schematic sectional diagram used to depict the fifth preferred embodiment of the invention. In FIG. 6, the constituent parts that are identical in structure and purpose as those used in the previous embodiments are labeled with the same reference numerals.

This embodiment is similar to the one shown in FIG. 4 except that the thermally-conductive piece, here designated by the reference numeral 600, has its bottom part deepened to such an extent as to come into direct contact with the IC chip 230 through the thermally-conductive paste 280, allowing the IC-produced heat during operation to be conducted directly through the exposed surface 602 of the thermally-conductive piece 600 to the atmosphere.

Figure 7:
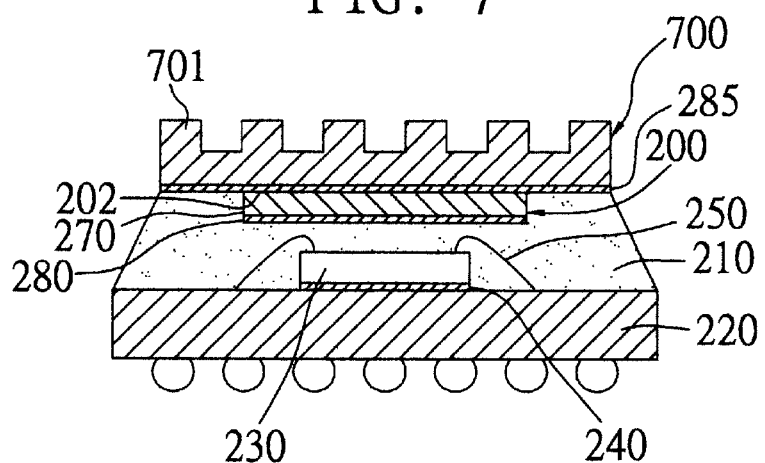
FIG. 7 is a schematic sectional diagram used to depict a sixth preferred embodiment of the invention.

Sixth Preferred Embodiment (FIG. 7)

FIG. 7 is a schematic sectional diagram used to depict the sixth preferred embodiment of the invention. In FIG. 7, the constituent parts that are identical in structure and purpose as those used in the previous embodiments are labeled with the same reference numerals.

This embodiment differs from the first embodiment shown in FIG. 1 only in the additional provision of a fin-shaped heat-dissipation piece 700 having a plurality of fins 701 over the exposed surface 202 of the thermally-conductive piece 200. The fin-shaped heat-dissipation piece 700 has its bottom side attached to the top side of the encapsulant 210 by means of a thermally-conductive paste 285, allowing its bottom side to come into direct contact with the thermally-conductive piece 200. This allows the IC-produced heat during operation to be dissipated to the atmosphere through an increased contact surface. Alternatively, a fan or a cool-water pipe can be coupled to the thermally-conductive piece 200 in lieu of the fin-shaped heat-dissipation piece 700.

Figure 8:
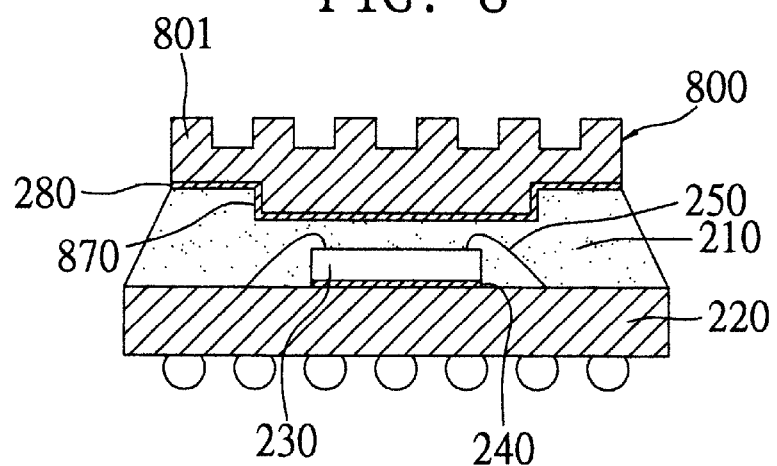
FIG. 8 is a schematic sectional diagram used to depict a seventh preferred embodiment of the invention.

Seventh Preferred Embodiment (FIG. 8)

FIG. 8 is a schematic sectional diagram used to depict the seventh preferred embodiment of the invention. In FIG. 8, the constituent parts that are identical in structure and purpose as those used in the previous embodiments are labeled with the same reference numerals.

This embodiment is similar to the previous one shown in FIG. 7 except that the finshaped heat-dissipation piece 700 and the thermally-conductive piece 200 used in the previous embodiment of FIG. 7 are here combined into an integrally-formed piece, here designated by the reference numeral 800. This heat-dissipating device 800 is formed with a plurality of fins 801 which can help increase the contact surface to the atmosphere. This embodiment is more advantageous than the previous embodiment of FIG. 7 in that it allows the overall assembly work to be simplified.

Figure 9:
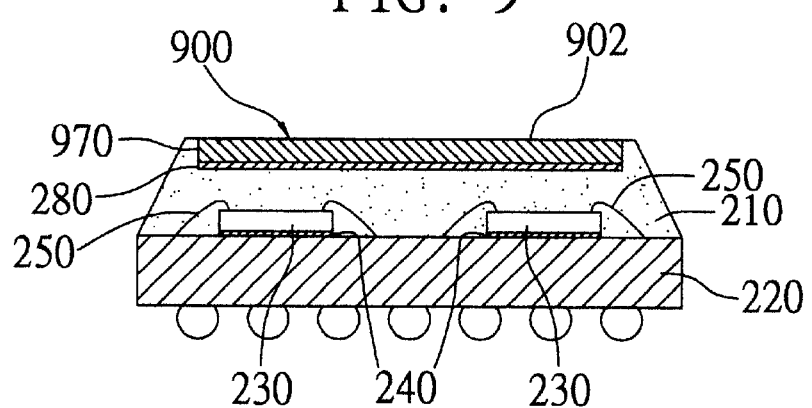
FIG. 9 is a schematic sectional diagram used to depict an eighth preferred embodiment of the invention.

Eighth Preferred Embodiment (FIG. 9)

FIG. 9 is a schematic sectional diagram used to depict the eighth preferred embodiment of the invention. In FIG. 9, the constituent parts that are identical in structure and purpose as those used in the previous embodiments are labeled with the same reference numerals.

This embodiment is used on an MCM type of BGA IC package having at least two IC chips 230, in which a thermally-conductive piece 900 is formed and mounted in the same manner as the thermally-conductive piece 100 used in the first embodiment of FIG. 1. The thermally-conductive piece 900 should be dimensioned in width to an extent that can cover both of the IC chips 230, so that the heat produced by both of the IC chips 230 during operation can be all conducted to the thermally-conductive piece 900 and dissipated through the exposed surface 902 of the thermally-conductive piece 900 to the atmosphere.

This embodiment is particularly more advantageous to use when mounted on an MCM type of BGA IC package than the prior art due to the fact that the heat-dissipating device of the invention requires no leg-like support portion to be mounted on the substrate which is already crowded with the IC chips.

Figure 10:
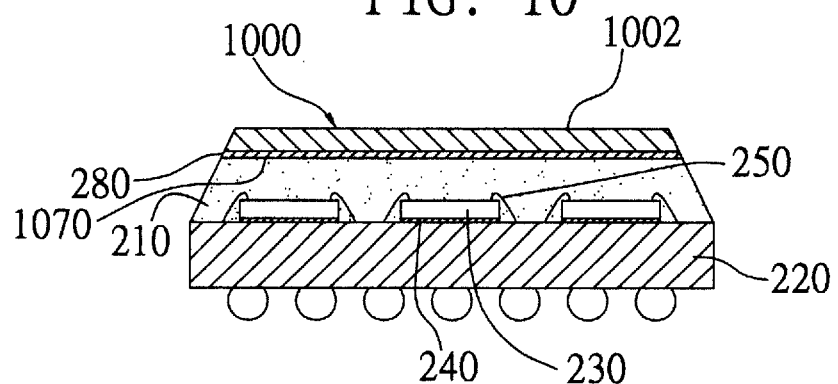
FIG. 10 is a schematic sectional diagram used to depict a ninth preferred embodiment of the invention.

Ninth Preferred Embodiment (FIG. 10)

FIG. 10 is a schematic sectional diagram used to depict the ninth preferred embodiment of the invention. In FIG. 10, the constituent parts that are identical in structure and purpose as those used in the previous embodiments are labeled with the same reference numerals.

This embodiment is used on an MCM type of BGA IC package having at least three IC chips 230 which take up substantially all the layout space over the substrate 220. In this embodiment, a thermally-conductive piece 1000 is formed to a width substantially equal to the width of the encapsulant 210 so that the thermally-conductive piece 100 can cover all of the three IC chips 230, so that the heat produced by all of the IC chips 230 during operation can be all conducted to the thermally-conductive piece 1000 and dissipated through the exposed surface 1002 of the thermally-conductive piece 1000 to the atmosphere.

As the previous embodiment, this embodiment is also more advantageous to use when mounted on an MCM type of BGA IC package than the prior art due to the fact that the heat-dissipating device of the invention requires no leg-like support portion to be mounted on the substrate which is already crowded with the IC chips.

Figure 11:
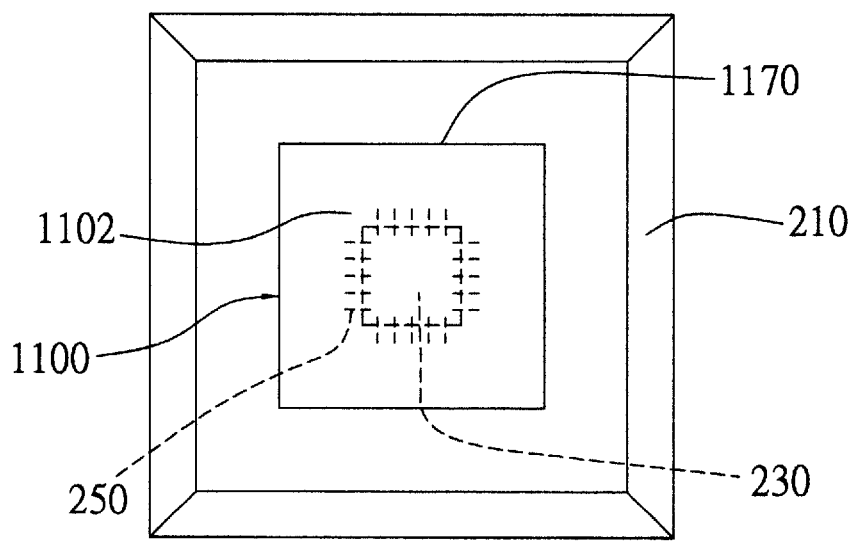
FIG. 11 is a schematic top view of a BGA IC package used to depict a tenth preferred embodiment of the invention.

Tenth Preferred Embodiment (FIG. 11)

FIG. 11 is a schematic top view of a BGA IC package used to depict the tenth preferred embodiment of the invention. In FIG. 11, the constituent parts that are identical in structure and purpose as those used in the previous embodiments are labeled with the same reference numerals.

In this embodiment, the heat-dissipating device, here designated by the reference numeral 1100, is formed with a squarely-shaped top surface 1102 as seen from the top. Fundamentally, it should be larger in dimension than the underlying IC chip 230.

Figure 12:
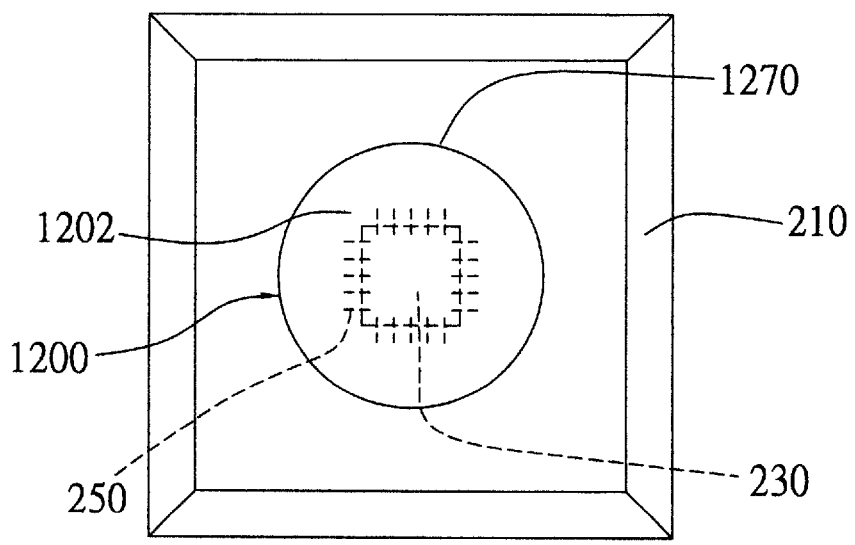
FIG. 12 is a schematic top view of a BGA IC package used to depict an eleventh preferred embodiment of the invention.

Eleventh Preferred Embodiment (FIG. 12)

FIG. 12 is a schematic top view of a BGA IC package used to depict the eleventh preferred embodiment of the invention. In FIG. 12, the constituent parts that are identical in structure and purpose as those used in the previous embodiments are labeled with the same reference numerals.

In this embodiment, the heat-dissipating device, here designated by the reference numeral 1200, is formed with a circularly-shaped top surface 1202 as seen from the top. Fundamentally, it should be larger in dimension than the underlying IC chip 230. Alternatively, the top surface of the heat-dissipating device can be a polygon Conclusion In conclusion, the invention provides a heat-dissipating device for BGA IC package, which has the following advantages over the prior art. First, the invention can help reduce manufacture cycle time and cost while nevertheless providing a heat-dissipation efficiency. Second, the invention can help prevent delamination so that the manufactured BGA IC package can be assured in quality. Third, the invention can help prevent the forming of voids in the encapsulant and thus prevent the undesired popcorn effect during the molding process. Fourth, the invention allows the heat-dissipating device to take up only a small area of the layout space on the substrate so that the overall package configuration can be made more compact. Fifth, the invention can help prevent the flash of flowing resin used in the molding process, so that it would be unnecessary to use sanding or laser means to remove flashed resin and thus allow the manufactured BGA IC package to be more assured in quality. Overall speaking, the invention is more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat-dissipating device for use with an IC package having at least one IC chip enclosed in an encapsulant, which comprises:

embedding means formed in a surface of the encapsulant and at a proximate position to the IC chip; and a thermally-conductive piece accommodated in the embedding means, which has a first surface facing against the IC chip and a second surface exposed to the outside of the encapsulant, wherein the thermally-conductive piece is attached to the embedding means after the encapsulant is readily formed.

2. The heat-dissipating device of claim 1, wherein the embedding means is a recess predefined to be formed in the encapsulant during the molding process.

3. The heat-dissipating device of claim 2, wherein the recess is formed by predefining a protruded portion on a mold used to form the encapsulant so that the recess can be readily formed during the molding process.

4. The heat-dissipating device of claim 1, 2, or 3, wherein the thermally-conductive piece is made of a thermally-conductive metal.

5. The heat-dissipating device of claim 1, 2, or 3, wherein the embedding means comprises a thermally-conductive paste which is used to adhere the thermally-conductive piece to the encapsulant.

6. The heat-dissipating device of claim 1, 2, or 3, wherein the thermally-conductive piece is dimensioned to such a width that is smaller than the width of the space above the IC chip defined by a plurality of bonding wires bonded to the IC chip.

7. The heat-dissipating device of claim 1, 2, or 3, wherein the thermally-conductive piece is substantially T-shaped in cross section, with the bottom part thereof being dimensioned to such an extent that allows it to be positioned above the IC chip and within the space defined by a plurality of bonding wires bonded to the IC chip without touching the bonding wires.

8. The heat-dissipating device of claim 1, 2, or 3, wherein the thermally-conductive piece is dimensioned in such a manner as to allow a surface thereof to come into direct contact with the front side of the IC chip.

9. The heat-dissipating device of claim 1, 2, or 3, further comprising:

a fin-like heat-dissipating device having a plurality of fins, which is externally coupled to the exposed surface of the thermally-conductive piece.

11. The heat-dissipating device of claim 1, 2, or 3, wherein the thermally-conductive piece is dimensioned to a width substantially equal to the width of the top surface of the encapsulant so as to cover the entire top surface of the encapsulant.

12. The heat-dissipating device of claim 1, 2, or 3, wherein the thermally-conductive piece is formed in a rectangular shape.

13. The heat-dissipating device of claim 1, 2, or 3, wherein the thermally-conductive piece is formed in a circular shape.

14. The heat-dissipating device of claim 1, 2, or 3, wherein the thermally-conductive piece is formed in a polygonal shape.

* * * * *